United States Patent [19]

Romeo et al.

[11] 3,848,261

[45] Nov. 12, 1974

[54] MOS INTEGRATED CIRCUIT STRUCTURE

[75] Inventors: Donald E. Romeo, Torrance; Neil P. Burcham, Rolling Hills, both of Calif.

[73] Assignee: TRW Inc., Redondo Beach, Calif.

[22] Filed: Nov. 28, 1973

[21] Appl. No.: 419,840

Related U.S. Application Data

[63] Continuation of Ser. No. 264,049, June 19, 1972, abandoned.

[52] U.S. Cl. .......... 357/71
[51] Int. Cl. .......... H01l 29/46
[58] Field of Search .......... 357/71, 30

[56] References Cited

UNITED STATES PATENTS

| | | | |
|---|---|---|---|
| 3,467,952 | 9/1969 | Shiraishi et al. | 317/235 |
| 3,543,052 | 11/1970 | Kahng | 317/235 |
| 3,739,239 | 6/1973 | Kerr | 317/235 |

*Primary Examiner*—Rudolph V. Rolinec
*Assistant Examiner*—E. Wojciechowicz
*Attorney, Agent, or Firm*—Daniel T. Anderson; Jerry A. Dinardo; Edwin A. Oser

[57] ABSTRACT

In an integrated circuit structure including a MOSFET coupled to a lead sulfide photoconductor, a first metallization level of aluminum is used to provide source and gate contacts. A second metallization level of gold is used to make drain contact and low noise contact to the lead sulfide layer. A heavily doped diffusion layer forms a conductive path for connecting the aluminum in the first metallization level with the gold in the second metallization level while keeping the aluminum and gold physically separate.

4 Claims, 2 Drawing Figures

MOS INTEGRATED CIRCUIT STRUCTURE

This is a continuation, of application Ser. No. 264,049, filed June 19, 1972, now abandoned. The invention herein described was made in the course of or under a contract or subcontract thereunder, with the Department of the Army.

BACKGROUND OF THE INVENTION

1. Field of the Invention

This invention relates to integrated circuits of the MOS (metal oxide semiconductor) variety; and more particularly to such circuits that are combined with variable impedance elements, such as photoconductive films, to form large scale integrated (LSI) circuit detector arrays.

2. Description of the Prior Art

One form of solid state electromagnetic radiation detector currently being developed comprises a planar array of elemental units arranged in rows and columns. Each unit comprises a MOSFET (metal oxide semiconductor field effect transistor) in series with a photodetector, such as a photocoductive element. Switching signals are sequentially applied to the rows and columns in such a way that the entire array is scanned. In an elemental unit area that receives incoming radiation, the illuminated photoconductor changes its impedance, and when that illuminated unit is interrogated, the impedance change in the photoconductor gives rise to an electrical output signal.

In LSI arrays using MOS circuitry, it is universally accepted to use aluminum films for making ohmic metallic contacts to semiconductive areas and for providing conductive interconnections and bonding pads. However, when a photoconductor such as lead sulfide is incorporated in an LSI radiation detector array, it has been found that a noisy contact results from depositing lead sulfide on an aluminum electrode. While a low noise metallic contact can be made to lead sulfide by using gold instead of aluminum for that purpose, care must be taken to avoid the direct contact between aluminum and gold deposits wherever interconnections between the MOS circuitry and the photoconductive elements are required. The reason for this is that certain undesirable intermetallic compounds may form when a silicon wafer containing both gold and aluminum is subjected to high temperature processing. The formation of these undesirable compounds at the interface of a gold to aluminum contact results in a gradual disintegration of the contact, among these is one commonly known as the "purple plague."

SUMMARY OF THE INVENTION

In accordance with the invention, a MOS integrated circuit structure is provided which includes source and drain electrode areas and a gate electrode insulatingly spaced therefrom. Ohmic contacts to the source and drain electrode areas are made by separate volumes of two different metals, such as aluminum and gold, one of the volumes being formed from the same type of metal that forms the gate electrode, or aluminum. The other volume of metal, such as gold, is extended to make contact with a layer of detector material, such as lead sulfide, that has a variable impedance characteristic in response to external stimuli, such as electromagnetic radiation.

According to a more specific feature of the invention, a low resistance diffusion is provided in a region of the substrate adjacent one of the MOS electrode areas to serve as a low resistance path for electrically interconnecting two other volumes of the two different metals while separating them physically so as to avoid direct contact therebetween.

DESCRIPTION OF THE PREFERRED EMBODIMENT

Figure 1:
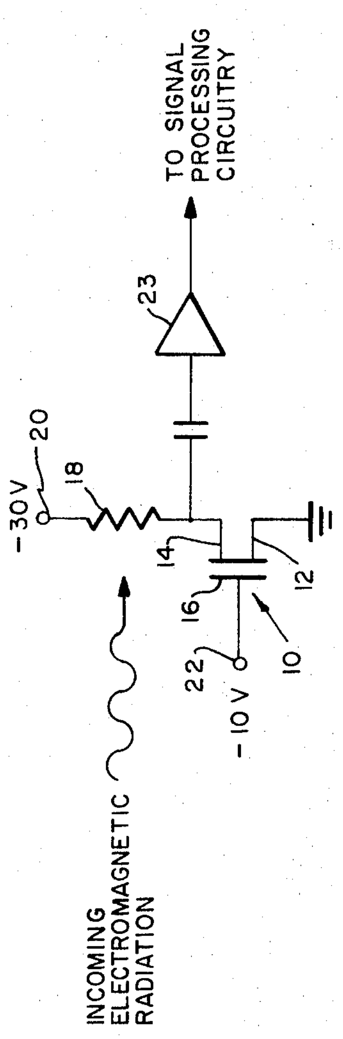
FIG. 1 is a simplified schematic diagram of an elemental unit in a photosensitive detector array.

Referring now to FIG. 1, there is shown a MOSFET 10 including a grounded source 12, a drain 14, and a gate 16. A variable impedance electromagnetic radiation detector element 18, such as a photoconductor, is connected between the drain 14 and a negative voltage supply terminal 20, such as −30 volts. The gate 16 is connected to a negative voltage supply terminal 22, such as −10 volts.

The MOSFET 10 functions as a current source that supplies a dc current to the detector element 18, with the current being controlled by the gate 16. When the detector element 18 is illuminated by incoming radiation, its resistance is modulated accordingly, thereby developing an ac voltage at the drain 14. The ac signal voltage is coupled to a MOS preamplifier 23 and other associated circuitry such as a video amplifier.

One of the difficulties encountered in integrating the above described MOS circuitry and radiation detector element in an LSI multi-element array involves the incompatibility of one of the metals, aluminum, commonly used in MOS circuitry, with the radiation detector material. Another difficulty arises from the incompatibility of aluminum with a second metal, gold, which desirably exhibits compatibility with the radiation detector material.

Figure 2:
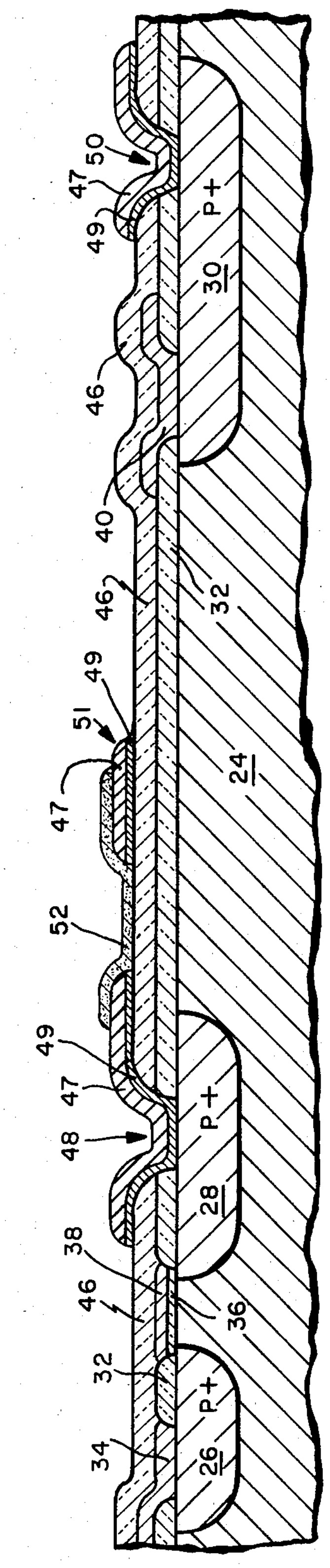
FIG. 2 is a greatly enlarged cross sectional view of a combined MOSFET and photosensitive detector constructed according to the invention.

According to the invention, a structure is provided that solves the aforementioned incompatibility problems. Referring now to FIG. 2, a substrate 24 of one conductivity type, such as N type silicon, is provided with a source region 26 spaced from a drain region 28. Both the source region 26 and the drain region 28 may be formed by a heavy diffusion of a P type impurity such as boron, so that the regions 26 and 28 comprise P+ regions.

A third P+ region 30 spaced from the source region 26 is formed similar to the source and drain regions 26 and 28. All of the P+ regions 26, 28, and 30 may be formed by the usual selective diffusion method, which involves depositing over the substrate 24 a layer of a suitable masking material that is immune to the diffusion impurity, providing holes in the masking layer by a photolithographic process to expose areas of the substrate where the diffusion is desired and diffusing the impurity through those holes into the exposed substrate surface areas.

A thick layer 32 of silicon dioxide dielectric material is deposited on the surface of the substrate 24. The dielectric layer 32 is provided with openings in selected areas, the openings being formed by the aformentioned photolithographic process which includes coating the dielectric layer 32 with a photoresist, exposing the photoresist with light through a negative of the desired hole pattern, dissolving the unexposed photoresist, etching away the dielectric layer in the regions not covered by photoresist to form the holes, and removing the photoresist.

The openings in the dielectric layer 32 define the regions for a first level of metallization by means of a first metal, which in this example, is aluminum. Thus, a volume 34 of aluminum is deposited in an opening over the source region 26 to make ohmic contact with the source region 26 and serve as the source contact. Another opening provided over the gap between the source region 26 and drain region 28 and slightly overlapping the same is partially filled with a layer 36 of dielectric material, such as silicon dioxide, and then provided with another volume or layer 38 of aluminum to form a gate electrode. Another volume 40 of aluminum fills an opening over the P+ region 30 and extends over the dielectric layer 32.

A second thick dielectric layer 46 of silicon dioxide is formed covering the first dielectric layer 32 and the metal volumes 34, 38 40. The second dielectric layer 46 is provided with openings which extend through the first dielectric layer 32 and provide access for making second level metallic contact to the drain region 28 and the P+ region 30. The second level metallization comprises a different metal from the aluminum used in the first level metallization and in this instance is comprised of gold. The gold deposition is preferably preceded by depositing a layer of chromium to promote adherence of the gold to the silicon dioxide layer 46. Thus, a first volume 48 including a layer 49 of chromium and a layer 47 of gold is provided in one opening to serve as the drain contact and another volume 50 including chromium and gold layers 49 and 47 is provided in another opening to make contact with the P+ region 30 at a point spaced from where the aluminum volume 40 makes contact with the P+ region 30. A third volume 51 including chromium and gold layers 49 and 47 is deposited on the second dielectric layer 46 spaced from the volume 48. Volume 51 corresponds to the negative voltage supply terminal 20.

A layer 52 of electromagnetic radiation detector material, such as lead sulfide or lead selenide is deposited on the second dielectric layer 46 covering the space between the two chromium and gold volumes 48 and 51 and overlapping their surface edges. The impedance of the radiation detector layer 52 is variable in accordance with the intensity of the incoming radiation.

It will now be seen that the metal oxide semiconductor field effect transistor, or MOSFET for short, is comprised of the source region 26 and source contact 34, the drain region 28 and drain contact 48, and the gate electrode formed by the metal volume or layer 38 spaced from the source and drain regions by the dielectric layer 36. The source contact 34 and gate electrode layer 38 in the first level of metallization are made of aluminum as is conventional in current MOS circuitry. However, because the drain contact 48 must also connect to the photoconductive or radiation detector layer 52, it is made of gold rather than aluminum in order to form a low noise contact with lead sulfide.

It has been found desirable in the design of MOS integrated circuits to form interconnections between lower and upper metallization levels, such as in addressing elements within $x$ - $y$ or two dimensional arrays. In such arrays, the $x$ lines are contained on one metallization level and the $y$ lines are contained on a second metallization level. In accordance with another feature of this invention, a conductive connection is made between the lower and upper metallization levels through the P+ region 30. For example, the lower end of the gold volume 50 of the second level contacts the P+ region 30 which in turn forms a conducting path to the lower end of the aluminum volume 40. of the first level. Thus the aluminum volume 40 and gold volume 50 are electrically coupled together through, but physically separated from each other by, the material in the heavily doped P+ region 30. Because of the incompatibility of the two metals, direct contact between the gold and aluminum is thus avoided. Nevertheless, an electrically conductive connection is effected between the areas of the two different metallization levels. The resistance of the P+ region 30 is not critical, and it should be kept as low as possible to reduce losses.

What is claimed is:

1. An integrated circuit structure, comprising:

a semiconductor substrate of one semiconductivity type:

first, second and third diffused semiconductor regions spaced from each other in said substrate and each being of opposite semiconductivity type relative to said substrate;

a first dielectric layer on said substrate;

a first metallization layer of aluminum on said first dielectric layer and having a first portion extending through said dielectric layer to form a source contact with said first diffused semiconductor region, a second portion extending over the gap between said first and second diffused semiconductor regions to form a gate, and a third portion extending through said dielectric layer to make ohmic contact with said third diffused semiconductor region;

a second dielectric layer on said first dielectric layer and said first metallization layer;

a second metallization layer of gold on said second dielectric layer and having a first portion extending through both said dielectric layers to form a drain contact with said second diffused semiconductor region, a second portion spaced from said first portion thereof, and a third portion extending through both said dielectric layers and forming ohmic contact with said third diffused semiconductor region at a location spaced from the third portion of said first metallization layer, said third diffused semiconductor region forming a conductive path between the third portions of said first and second metallization layers, respectively; and a layer of variable impedance electromagnetic radiation responsive detector material on said second dielectric layer extending between said first and second portions of said second metallization layer and in contact therewith, said detector material being selected from the group consisting of lead sulfide and lead selenide.

2. The invention according to claim 1, wherein said substrate is made of silicon.

3. An integrated circuit photodetector structure, comprising:

a. a semiconductor substrate including therein a MOSFET having a source region and a drain region, and a heavily doped region all spaced from each other;

b. a first metallization layer of aluminum insulatingly spaced from the surface of said substrate and including a first volume thereof forming ohmic contact with one of said source and drain regions, a second volume thereof spaced from both said source and drain regions and forming therewith a gate for a MOSFET, and a third volume thereof forming ohmic contact with said heavily doped region;

c. a second metallization layer of gold insulatingly spaced from said first metallization layer and including a first volume thereof forming ohmic contact with the other one of said source and drain regions, a second volume thereof spaced from said first volume, and a third volume thereof forming ohmic contact with said heavily doped region at a location spaced from the third volume of said first metallization layer; and d. a layer of detector material selected from the group consisting of lead sulfide and lead selenide bridging the gap between the first and second volumes of said second metallization layer and forming ohmic contact therewith;

e. said heavily doped region providing a conductive path between said third volumes of said first and second metallization layers, respectively.

4. The invention according to claim 3 wherein said substrate is made of silicon.

* * * * *